United States Patent
Shiramizu et al.

(10) Patent No.: US 7,642,618 B2
(45) Date of Patent: Jan. 5, 2010

(54) SEMICONDUCTOR DEVICES WITH INDUCTORS

(75) Inventors: Nobuhiro Shiramizu, Kokubunji (JP); Takahiro Nakamura, Kokubunji (JP); Toru Masuda, Kokubunji (JP); Nobuhiro Kasa, Yoshii (JP); Hiroshi Mori, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 85 days.

(21) Appl. No.: 11/183,800

(22) Filed: Jul. 19, 2005

(65) Prior Publication Data

US 2006/0038621 A1 Feb. 23, 2006

(30) Foreign Application Priority Data

Aug. 20, 2004 (JP) ............................. 2004-240569

(51) Int. Cl.
*H01L 27/00* (2006.01)
*H01F 27/28* (2006.01)

(52) U.S. Cl. .................... 257/531; 257/E21.022; 336/195; 336/200

(58) Field of Classification Search ............. 257/531, 257/E21.022; 336/195, 200
See application file for complete search history.

(56) References Cited

U.S. PATENT DOCUMENTS

| | | | | |
|---|---|---|---|---|
| 5,656,849 | A * | 8/1997 | Burghartz et al. | 257/528 |
| 5,936,299 | A * | 8/1999 | Burghartz et al. | 257/531 |
| 5,942,965 | A * | 8/1999 | Kitamura et al. | 336/200 |
| 6,054,329 | A * | 4/2000 | Burghartz et al. | 438/3 |
| 6,160,303 | A * | 12/2000 | Fattaruso | 257/531 |
| 6,448,873 | B1 * | 9/2002 | Mostov | 333/185 |
| 6,784,548 | B2 * | 8/2004 | Kouno et al. | 257/758 |
| 6,921,959 | B2 * | 7/2005 | Watanabe | 257/531 |
| 7,022,566 | B2 * | 4/2006 | Wong et al. | 438/228 |
| 7,026,904 | B2 * | 4/2006 | Gomez et al. | 336/200 |
| 2005/0037535 | A1 * | 2/2005 | Ogawa et al. | 438/106 |
| 2005/0068146 | A1 * | 3/2005 | Jessie | 336/200 |

(Continued)

FOREIGN PATENT DOCUMENTS

CN 1875484 A 12/2006

(Continued)

OTHER PUBLICATIONS

By Tallis Blalack et al. and 'IEEE BCTM 2002 Proceedings', "On-Chip RF Isolation Techniques", pp. 205 to 211, printed in 2002.

(Continued)

*Primary Examiner*—David Vu
*Assistant Examiner*—Earl N Taylor
(74) *Attorney, Agent, or Firm*—Antonelli, Terry, Stout & Kraus, LLP.

(57) ABSTRACT

Semiconductor devices are provided with high performance high-frequency circuits in which interference caused by inductors is reduced. In a semiconductor device including a modulator circuit to modulate a carrier wave by a base band signal to output an RF signal and a demodulator circuit to demodulate the RF signal by use of the carrier wave to gain the base band signal and a local oscillator to generate the carrier wave, inductors respectively having a closed loop wire are adopted. Interference caused by mutual inductance is reduced by the closed loop wire. For example, where inductors are adopted in the modulator circuit, a closed loop wire is disposed around the outer periphery of the inductors.

18 Claims, 10 Drawing Sheets

U.S. PATENT DOCUMENTS

2005/0247999 A1* 11/2005 Nishikawa et al. .......... 257/531
2007/0109065 A1* 5/2007 Pipilos ...................... 331/167

FOREIGN PATENT DOCUMENTS

| JP | 2003-249555 | 9/2003 |
|---|---|---|
| WO | WO 2004/032229 A1 * | 4/2004 |
| WO | WO 2005/034239 A2 | 4/2005 |

OTHER PUBLICATIONS

By Hisao Kumagai et al., "Physics Lecture vol. 5 on Electromagnetics", p. 146, Published in 1965 by Asakura Shoten Co., Ltd.
By Behzad Razavi, "RF Microelectronics", p. 247, published in 2002 by Maruzen Corporation.

* cited by examiner

SEMICONDUCTOR DEVICES WITH INDUCTORS

CLAIM OF PRIORITY

The present application claims priority from Japanese application JP 2004-240569, filed on Aug. 20, 2004, the content of which is hereby incorporated by reference into this application.

FIELD OF THE INVENTION

The present invention relates in general to semiconductor devices with inductors, and, more specifically, the invention relates to semiconductor devices that are suitable for use in the high frequency circuits of a wireless communication device.

BACKGROUND OF THE INVENTION

An inductor for use in a circuit, in which high frequency signals in the vicinity of the GHz band are received and transmitted, can be incorporated into a semiconductor device because of its smaller inductance. In this case, there are some countermeasures that can be used against the problem brought about by the fact that other inductors and wires, etc., may be disposed close to the inductor located within a minute interior of the semiconductor device. For example, an integrated circuit is disclosed in Patent Document I as a strip of a well of high concentration and conductivity, which is embedded in a semiconductor substrate disposed below an inductor for the purpose of reducing the overcurrent induced by the inductor formed on the upper surface of the semiconductor substrate and for attenuating the effect of crosstalk on elements inside of the substrate.

Also, Non-Patent Document 1 discloses an arrangement in which inductors 5 and 8, provided with inputs 6 and 10, are respectively enclosed by grounded wires 7 and 9 that have a large width, as shown in the appended FIG. 13, in order to attenuate interference caused by the mutual inductance between two inductors.

In Non-Patent Document 2, the principle of the effect brought about by the magnetic field created around an inductor is explained with reference to the Biot-Savart law.

Further, in Non-Patent Document 3, the drawing effect, in which the frequency of an oscillator using one inductor is changed by the effect brought about by other inductors, is explained.

(Patent Document 1) Refer to Japanese Patent Application Laid-open No. 2003-249555.

(Non-Patent Document 1) Refer to 'On-chip RF Isolation Techniques' by Tailis Blalack and two others in USA and 'IEEE BCTN 2002 Proceedings' printed in 2002, p. 205 to p. 211.

(Non-Patent Document 2) Refer to 'Physics Lecture Volume 5 on Electromagnetics' by Hisao Kumagai and another, published in 1965 by Asakura Shoten Co., Ltd., p. 146.

(Non-Patent Document 3) Refer to 'RE Microelectronics' by Behzad Razavi, published in 2002 by Maruzen Corporation, p. 247.

SUMMARY OF THE INVENTION

Although an inductor, which is one of the fundamental passive elements of a circuit, is used widely in an oscillator, a filter, a matching circuit, a transformer and so forth, it is scarcely used for a semiconductor device produced by a common method because of the difficulty in obtaining a larger inductance. However, when a high-frequency circuit to be packaged in a portable wireless communication terminal is incorporated into a semiconductor device, an inductor can be formed with a practical layout area by use of the wiring techniques of the semiconductor device, because the inductance required for such a high frequency circuit is of lower value, so that plural inductors are feasible for use therein. The provision of an inductor allows an oscillator, a filter, a matching circuit, a modulator circuit and so forth to be integrated into one semiconductor device, which renders the semiconductor device multi-functional. In this way, an RF-IC (Radio Frequency-Integrated Circuit) is realized, where a high frequency circuit is incorporated into the semiconductor device, which circuit includes a modulator circuit in which a radio frequency signal (hereinafter referred to as an 'RF signal') is produced by subjecting a base band signal to modulation, a demodulator circuit operating contrary to that of the modulator circuit and a local oscillator to generate carrier waves used for modulation and demodulation.

The integration density of a semiconductor device has become higher year by year due to a demand for cost reduction, in accordance with which plural inductors are disposed within one semiconductor device. Thus, the result is that the inductors and the circuits are disposed nearby therein, so that problems occur, such as signal interference between inductors and interference between inductors and wires. The occurrence of such signal interference within the semiconductor device invites a possibility of malfunction of the circuits, an output of unwanted noise and deterioration of the input sensitivity. Especially, for a wireless communication circuit including an RF-IC, there is a big difference in signal strength between carrier waves and received/transmitted signals, so that a large gap for isolation of about −70 dB is required between the local oscillator used to generate carrier waves and the output circuit which outputs RF signals.

In particular, in the case of an RF-IC in such direct conversion system for directly converting base band signals into radio frequency signals without the step of converting the former into intermediate frequency signals, it often happens that the frequency of the local oscillator signals and that of the RF signals are almost the same or are close to a multiple ratio relation. Thus, when there is interference between the local oscillator signals and the RF signals, serious intermodulation distortion and undesired leakage of disturbing waves will typically occur. It is hard to improve the signals by use of a filter once they are subjected to intermodulation distortion owing to interference, since interference signal components exist within the same frequency band as the desired signals. Furthermore, if interference occurs on a route through a parasitic element, it is impossible to incorporate an element in the circuit to hamper interference in the course of such route.

Accordingly, a technique is sought that reduces interference, caused by signal leakage among circuits, that is generated within the semiconductor device. As mentioned earlier, in the Patent Document 1, a method is disclosed for blocking interference signals transmitted through a semiconductor substrate, but it cannot restrain the effect brought about by the mutual inductance between inductors.

Mutual inductance occurs due to changes in the magnetic fields between two inductors. Inputting a high-frequency signal into an inductor generates an AC magnetic field, along with which an induced electromotive force occurs in the inductors and wires disposed in the vicinity thereof. An induced current caused by such induced electromotive force flows between circuits that are supposed to be isolated so as to turn into unwanted interference signals, which cause problems within the semiconductor device. Thus, the larger the mutual inductance is, the greater the degree of interference is.

The effect brought about by magnetic fields generated in the vicinity of the inductors is reduced as the distance between an observation point and the respective inductors increases, as disclosed in the Non-Patent Document 2 in reference to the Biot-Savart law. Accordingly, countermeasures are conventionally, taken such as establishing a wire prevention region in the surrounding area of the respective inductors so as to separate inductors and wires from one another that are vulnerable to interference. However, such countermeasures have drawbacks, because such a wire prevention region requires extra room in the semiconductor device, which hampers efforts to increase the integration density and prevents a reduction in the layout size of the substrate.

Therefore, it is necessary to block signal transmission caused by magnetic field fluctuation among inductors. For that purpose, in general, the respective inductors are enclosed by a conductive plate or box. In the structural arrangement of a semiconductor device, typically, either the upper and lower portions or one side of the respective inductors is enclosed by a conductive plate made of metal layers. However, in a standard semiconductor device, the interval between such metal layers becomes so narrow that a large parasitic capacity occurs between the respective inductors and the corresponding conductive plates. Thus, the composite impedance of the respective inductors and such parasitic capacity turns out to be basically capacitive, which makes it hard to gain the desired inductance.

The method as described in the Non-Patent Document 1, and as shown in FIG. 13, whereby the respective inductors, which are enclosed with grounded wires having a large width and are made of metal layers, is feasible to attenuate interference caused by mutual inductance. However, this method has the following drawbacks. The first problem is that the ground wires 7 and 9 used to be grounded in such an ideal manner that there is no potential fluctuation in those wires. For a semiconductor device, it is hard to make the impedance of the respective ground wires lower over wide range of frequency, because a parasitic element, such as a bonding wire, exists therein. Accordingly, signals with a voltage amplitude occur even on such ground wires. Further, such ground wires act as a common terminal between circuits, so that the signals generated in one circuit or another easily interfere with the inductors. The second problem is that disposing a wire which occupies a large area around the respective inductors, for the purpose of insuring that the respective ground wires come closer to an ideal grounding condition, causes a parasitic capacity on a semiconductor substrate. As a result, an induced current generated on the respective ground wires becomes hard to flow, thereby to minimize the effect on interference attenuation brought about by such induced current.

In the Non-Patent Document 1, for the convenience of measuring the amount of the signal transfer through the semiconductor substrate, two inductors are isolated by enclosing them with respective ground wires. For a semiconductor device, it is hard to isolate elements by use of ground wires in view of the restriction on the number of terminals incorporated in the semiconductor device and the stable operation of the circuits incorporated therein. Isolation produced by wider ground wires in order to lower the impedance enlarges the layout area of the circuits and deteriorates the integration density.

It is an object of the present invention to provide a high-performance semiconductor device with high frequency circuits incorporated therein, wherein the interference between inductors is attenuated.

The semiconductor device according to the present invention includes a first circuit which operates to modulate a carrier wave by use of a first signal and to output a second signal whose frequency is higher than that of the first signal; a second circuit which operates to demodulate a third signal by use of the carrier wave and to output a fourth signal whose frequency is lower than that of the third signal; and a third circuit which operates to generate the carrier wave, wherein at least one of the first through third circuits is provided with at least one inductor, and the one inductor is provided with a closed loop wire enclosing the one inductor.

As will be mentioned later, the enclosure formed around the respective inductors by the closed loop wire attenuates the interference caused by mutual inductance. The first through third circuits are realized as a modulator circuit, a demodulator circuit and a local oscillator, respectively, which circuits are formed as high-frequency circuits, in which inductors are provided. Even when such high-frequency circuits are integrated into one semiconductor device, so that the respective circuits are disposed adjacently, the attenuation of interference caused among the circuits allows a high-performance in the operation of such high-frequency circuits that are incorporated into a semiconductor device.

DETAILED DESCRIPTION OF THE PREFERRED EMBODIMENTS

Figure 1:
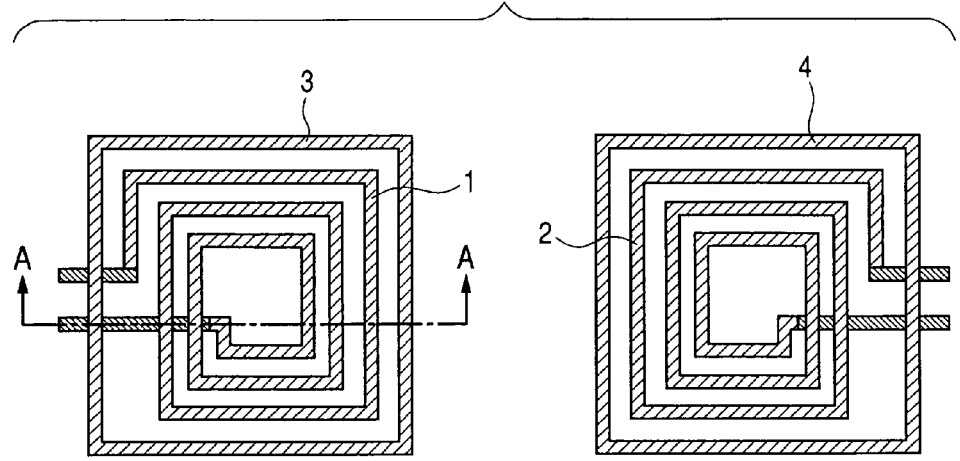
FIG. 1 is a top view showing the inductor used for the semiconductor devices in accordance with the present invention.

Hereinafter, various examples of semiconductor devices with high-frequency circuits according to the present invention will be described in more detail with reference to the accompanying drawings. To note, the same reference numbers and symbols identify the same, similar or equivalents elements in FIGS. 1, 2 and 6 through 12.

To begin with, the arrangement of the respective inductors that are used for the semiconductor devices according to the present invention will be explained with reference to FIG. 1. In the drawing, the inductors include an interference source side inductor 1, an interfered with side inductor 2, a wire 3 for reducing the inductive coupling corresponding to the interference source side inductor and a wire 4 for reducing the inductive coupling corresponding to the interfered with side inductor. The wire 3 is disposed such that it circumscribes the inductor 1 so as to define a closed loop. The wire is not limited to a square configuration, but may be curved, linear or a combination thereof. Likewise, the wire 4 is disposed such that it circumscribes the interfered with side inductor 2 so as to define a closed loop.

Such a connection for the wires 3 and 4 prohibits an AC signal from flowing not only to the inductors 1 and 2, but also to any electrode bf the circuit. To note, it is unfavorable to make stubs or slits on the respective wires 3 and 4 long enough to produce an effect on the wavelength of a high-frequency signal flowing in the respective inductors. For example, when a slit pattern is inserted between the metal layers of the respective inductors and the substrate to prevent an overcurrent from being generated on the substrate and the pattern is connected in such a manner that it goes around the respective inductors, a parasitic capacity is generated between the respective inductors and the pattern. Thus, the electric current flowing in the wire for reducing the inductive coupling is reduced, and a favorable effect on interference reduction is spoiled.

Figure 2:
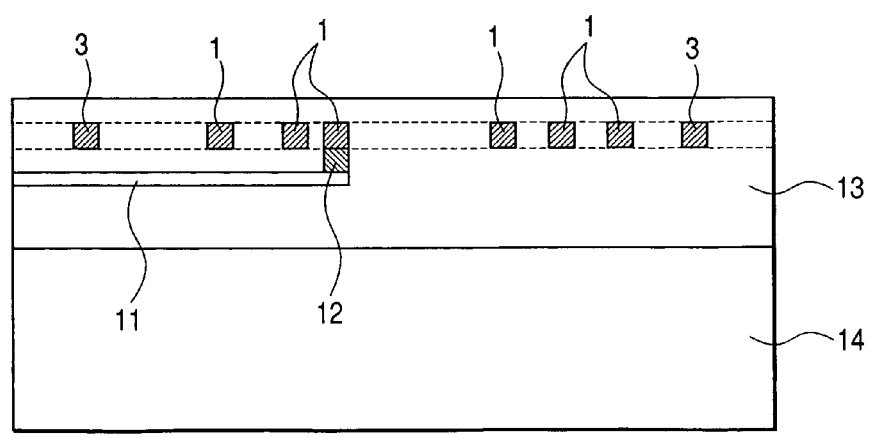
FIG. 2 is a sectional view showing the inductor used for the semiconductor devices of the present invention.

FIG. 2 shows a sectional view of the inductor 1 taken along A-A line of FIG. 1. In FIG. 2, reference numerals 11, 12, 13 and 14 respectively indicate a wire crossing with the inductor 1 and the wire 3 for reducing the inductive coupling, a via made from a conductive material to vertically 10 interconnect discrete metal layers and to connect the inductor 1 with the wire 3, an isolation layer and a semiconductor substrate. It is shown therein that the inductor 1 and the wire 3 are formed in the same metal layer to maximize the effect for reducing the inductive coupling, but they need not necessarily be formed in the same layer.

Figure 3:
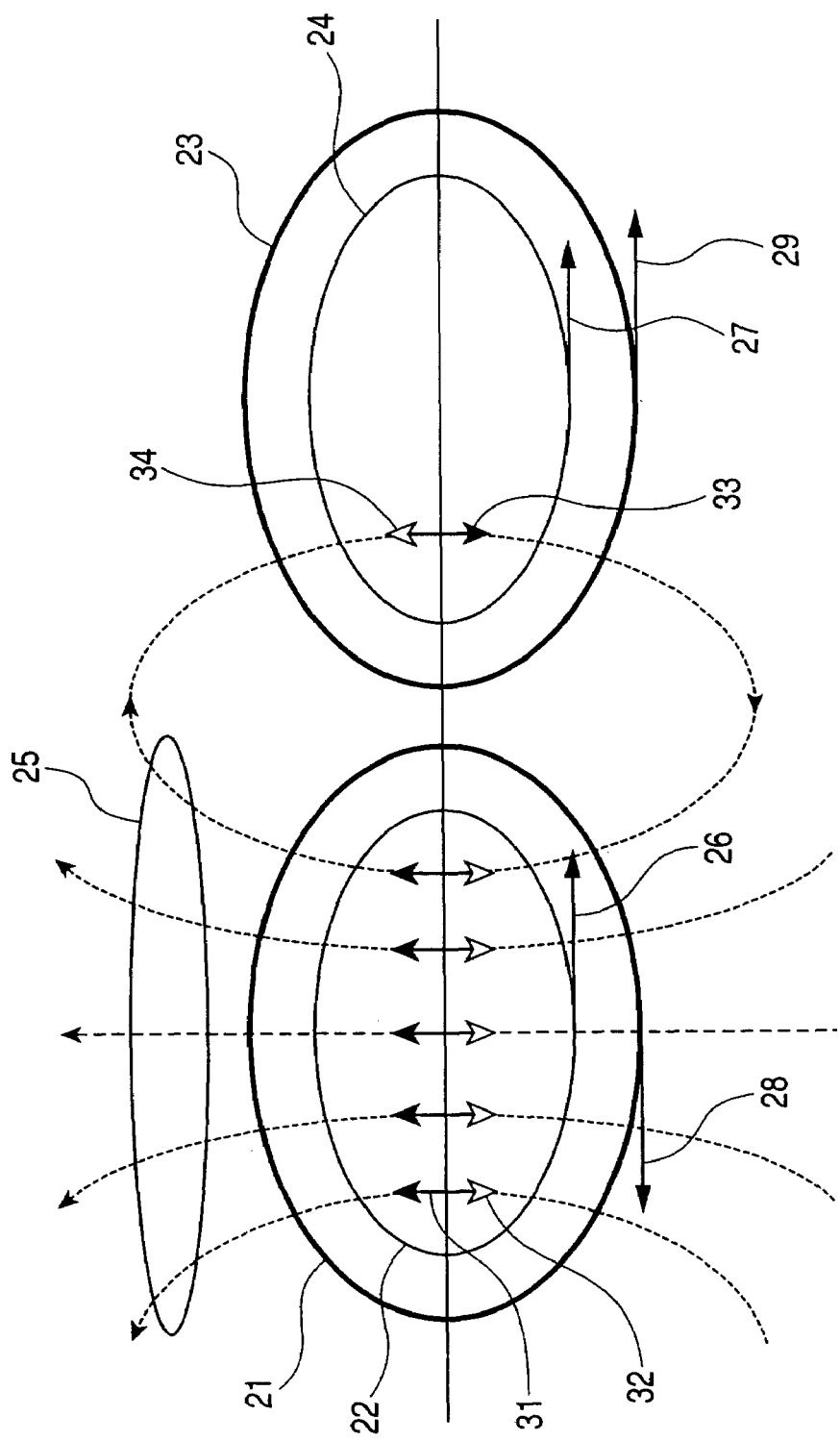
FIG. 3 is a diagram showing the effect of reducing inductive coupling caused by the semiconductor devices of the present invention.

The principle according to which interference, caused by the mutual inductance between the interference source side inductor 1 and the interfered with side inductor 2, is attenuated will be explained with reference to FIG. 3. FIG. 3 exemplifies the state in which magnetic fields are generated in response to the configurations as shown in FIG. 1, and it shows circular loops through which electric current flows. In the drawing, there is a current loop 21 according to the wire 3 of the interference source side for reducing the inductive coupling, a current loop 22 according to the inductor 1, a current loop 23 according to the wire 4 for reducing the inductive coupling and a current loop 24 according to the inductor 2.

When an alternating signal current 26 flows through the loop 22 according to the inductor 1, an AC magnetic field 25 5 is generated. The direction of the field corresponds to a direction 31, which is vertical with regard to the surface formed by the loop 22 and to which a right-handed screw advances when the same turns to the direction of the current 26 in accordance with Biot-Savart law, as shown in the Non-Patent Document 2. The AC magnetic field 25 changes to the opposite direction as the direction and strength of the current 26 varies. The surface formed by the loop 21 according to the wire 3 is almost the same as that formed by the loop 22, so that under the influence of an AC magnetic field 31, an induced current 28 flows through the loop 21 according to the wire 3 in accordance with Lenz's law. The direction of the current 28 corresponds to the direction which generates a magnetic field to the direction 32 which offsets a magnetic field generated on the loop surface in accordance with Lenz's law. An AC magnetic field is generated to the vertical direction 33 with regard to the surface formed by the loop 24 according to the inductor 2. Based on Lenz's law, as shown in the Non-Patent Document 2, an induced current 27 flows through the loop 24 by the inductor 2, while an induced current 29 flows through the loop 23 by the wire 4. The direction to which the currents 27 and 29 flow corresponds to the direction which generates a magnetic field to the direction 34 that sets off the magnetic field 33.

Accordingly, the respective magnetic fields 32 and 34 generated by the respective induced currents 28 and 29 cause the magnetic field 33 to be small. Thus, the induced current 27, which is an interference current generated in the inductor 2, is reduced by the induced currents 28 and 29. That is to say, the foregoing indicates that the input current 26 turns to the output induced current 27 through the magnetic fields 31, 25 and 33 so that transmitted interference signals are attenuated. The induced current 27 is generated by the mutual inductance between the inductors 1 and 2 so that the wires 3 of the interference source side for reducing the inductive coupling to generate the induced current 28 and the wire 4 of the interfered with side for reducing the inductive coupling to generate the induced current 29 cooperatively attenuate the interference caused by the mutual inductance between the inductors 1 and 2. To note, according to the above principle, disposing the wire for reducing the inductive coupling on one of the interference source side and the interfered with side may be less effective than being disposed on both sides, but interference is reduced anyway.

The above-described effect on the interference attenuation is confirmed below with reference to the experimental results and the calculation results by electromagnetic analysis.

Figure 4:
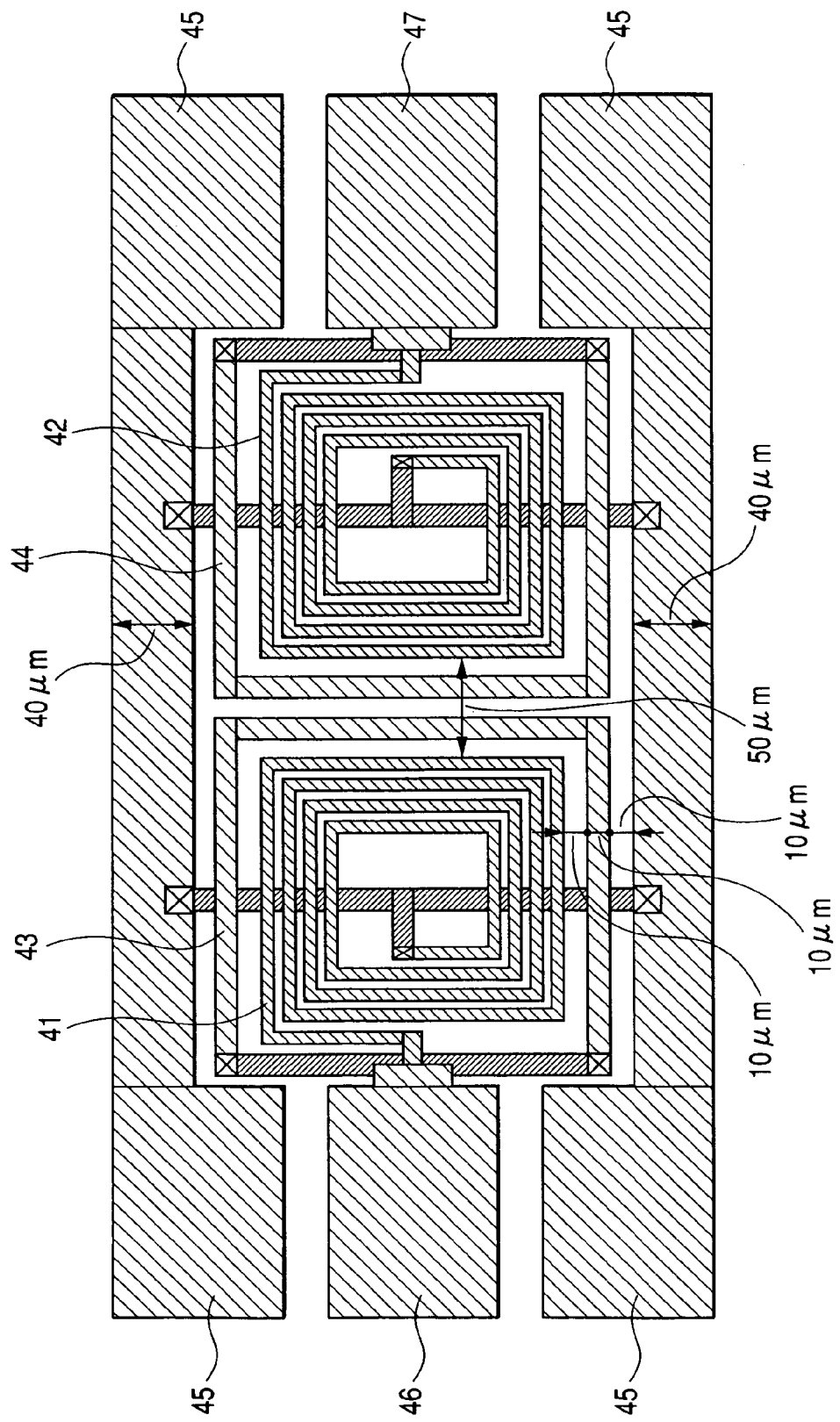
FIG. 4 is a top view of the inductor for measurement to evaluate the effect of the semiconductor devices of the present invention.

FIG. 4 shows a top view of the layout pattern that has been prepared for making a comparison by measurement between a case where the invention is incorporated and a case where the invention is not incorporated. In the drawing, there are an interference source side inductor 41, an interfered side inductor 42, a wire 43 of the interference source side for reducing the inductive coupling, a wire 44 of the interfered with side for reducing the inductive coupling, a ground pad 45, an input pad 46 and an output pad 47. The respective portions where the inductor 41 and the wire 43 intercross, as well as the inductor 42 and the wire 44 intercross, define two-tiered metal layers. The input pad 46 of the inductor 41 and an input opposite thereto and the output pad 47 of the inductor 42 and an output opposite thereto respectively are connected to a common ground 45, so that there is no route through which interference signals are transmitted by way of the wires.

Figure 5:
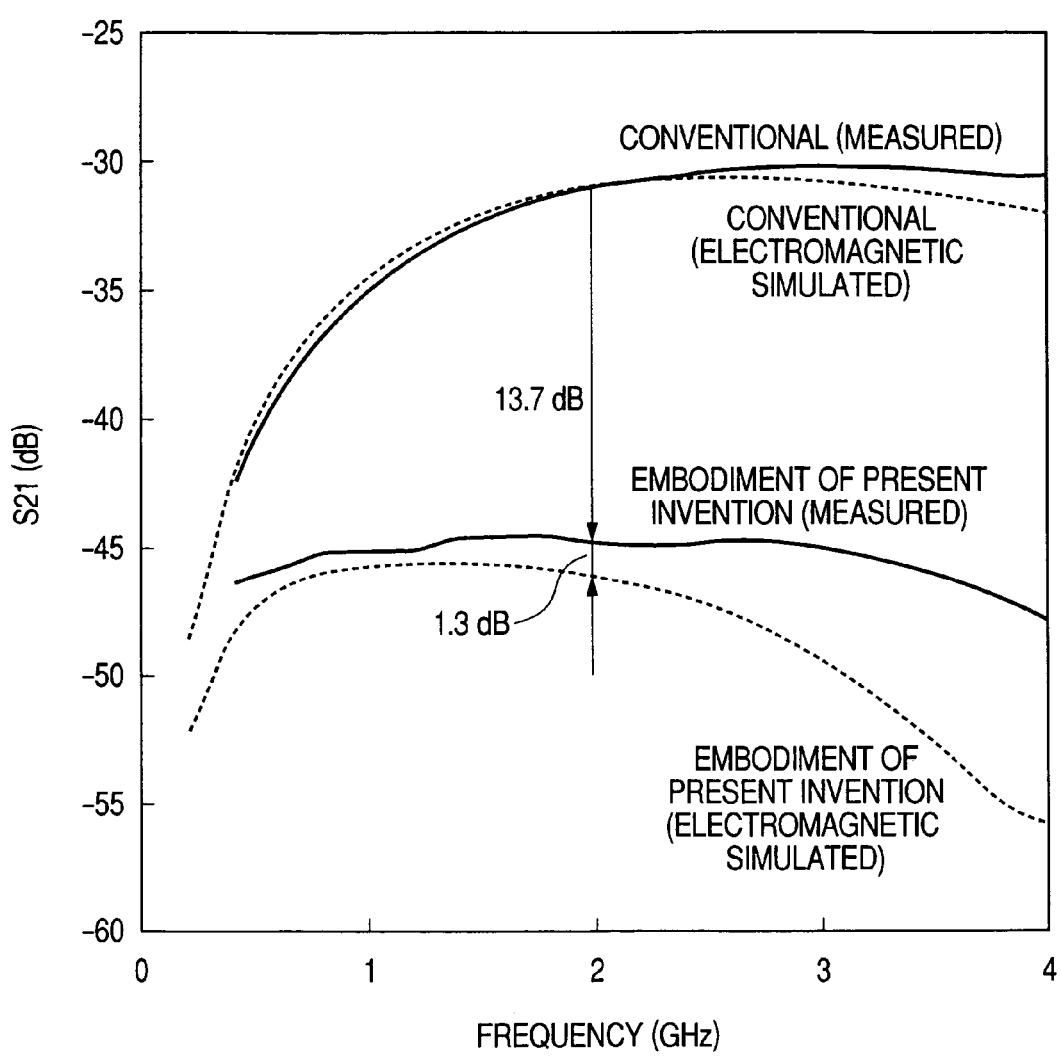
FIG. 5 is a graph showing the effect of the present invention.

FIG. 5 shows the experimental results measured by a Network Analyzer 8510 XF, produced by Agilent Technologies, and the calculation results produced by Momentum, which is an electromagnetic field analysis software produced by Agilent Technologies, both for the layout pattern as shown in FIG. 4 and a conventional layout pattern where the wires 43 and 44 as shown in FIG. 4 are not included. The vertical axis of the graph indicates the largeness in the unit of dB of the transfer coefficient between input and output signals from the inductor 41 to the inductor 42, while the horizontal axis thereof represents frequency. According to FIG. 5, it is seen that the transfer coefficient of the layout pattern shown in FIG. 4 is reduced by 13.7 dB at the frequency of 2 GHz in comparison with the conventional embodiment. Also, as a result of the electromagnetic field analysis, it was found that the degree to which interference is attenuated at the frequency of 2 GHz is predicted to be within an error of about 1.3 dB.

In the foregoing, the interference conveyed from the inductor 1 to the inductor 2 has been explained, but where a linear wire is the subject matter, it causes an inductance at a higher frequency, so that the disposition of the wire 3 for reducing the inductive coupling around the inductor 1 allows interference caused by the inductor 1 to the linear wire to be restrained.

The same effect as described above is realized by enclosing other inductors and elements or circuits in the vicinity of the inductor 1 in addition to the inductor itself with the wire 3 for reducing the inductive coupling by forming a closed loop wire.

Figure 6:
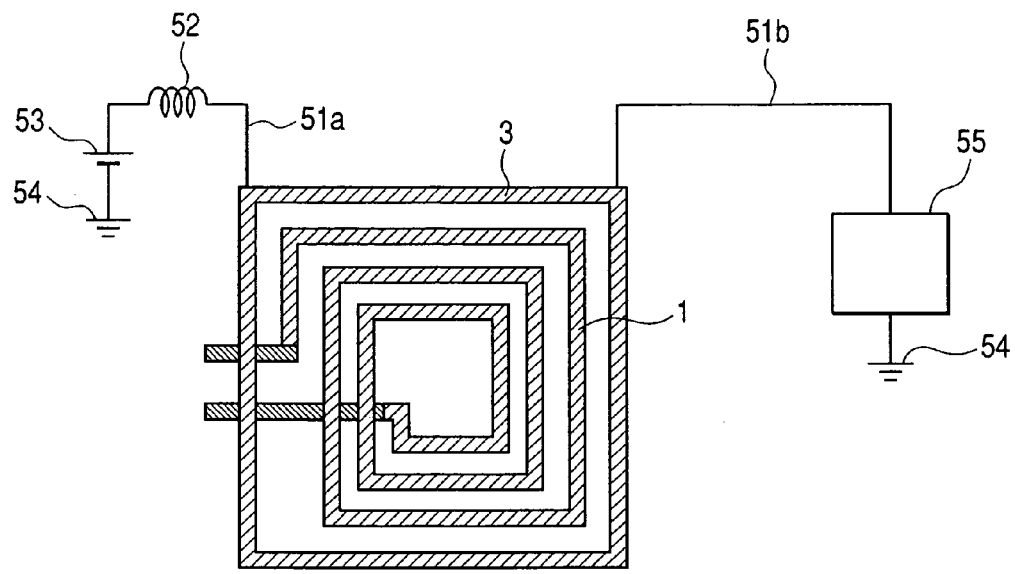
FIG. 6 is a circuit diagram showing the inductor used for the semiconductor devices of the present invention.

Further, the wire 3 for reducing the inductive coupling is usable for conveying a DC voltage with AC signals removed therefrom and for ground wiring. FIG. 6 shows such use of the wire 3 for reducing the inductive coupling. The DC from a power source 53 connected to a ground 54 passes through the wire 3 via an AC signals block circuit 52 and a DC potential connection wire 51a and reaches a circuit 55 via a DC potential connection wire 51b so as to drive the circuit 55 connected to the ground 54.

The wire 3 for reducing the inductive coupling must be arranged such that AC signals derived from an induced current flow for the purpose of reducing interference, while a DC potential is provided in such an arbitrary manner as by floating or from another circuit. Alternatively, the wire 3 may be a route through which a DC flows by interconnecting plural DC wires. However, it is required that in a circuit section including the DC potential connection wire 51, the AC signals block circuit 52, the power source 53, the ground 54 and the circuit 55, the Ac signals block circuit 52 is a choke coil and AC signals not derived from the induced current do not flow through the wire 3, for example. Should AC signals not derived from the induced current flow through the wire 3, the signals are conveyed from the wire for reducing the inductive coupling to the inductor through magnetic fields, with the result that unwanted signals are overlapped on the inductor. The arrangement as shown in FIG. 6 allows a spatial occupancy for the wire, which is provided for reducing the inductive coupling, to decrease by the amount of the wire width of the power source and the space between the wires, which results in a reduction in the layout size of the semiconductor device and an improvement in the integration density thereof. This fact is important especially for a semiconductor device whose size is of the essence.

Figure 7:
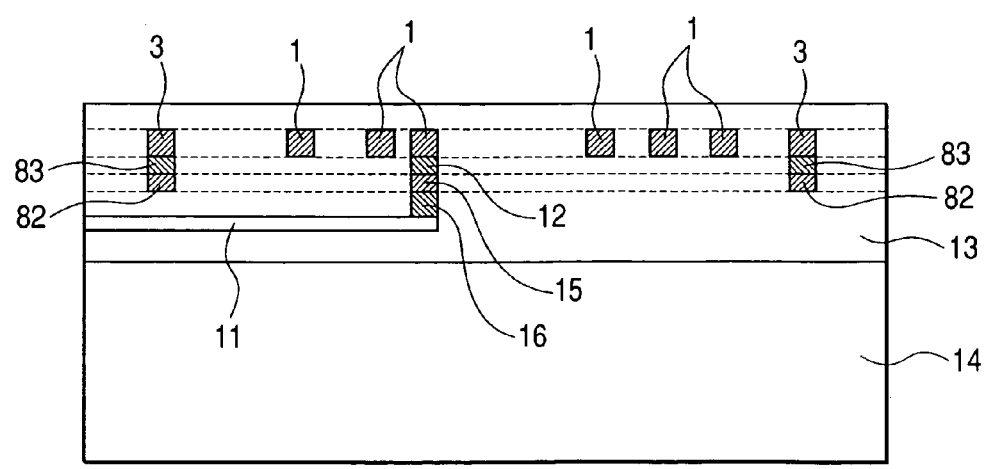
FIG. 7 is a sectional view showing the inductor used for the semiconductor devices of the present invention.

An inductor, in which the effectiveness of the wire provided for reducing the inductive coupling is enhanced by using two-tiered metal layers, is shown in FIG. 7. This wire for reducing the inductive coupling includes two metal layers and a via to vertically interconnect those metal layers. In FIG. 7, reference numerals 82 and 83 respectively indicate a wire for further reducing the inductive coupling formed on the second metal layer and a via to interconnect the wires 3 and 82. To note, a wire 11 is formed on the third metal layer, and it is connected to the inductor 1 through a connection wire 15 that is engaged to a via 12 and formed on the second metal layer, as well as a via 16. FIG. 7 is the sectional view of the layout pattern taken along at the same line as FIG. 2. The inductor shown in FIG. 7 is characterized in that more of an induced current flows by reducing the inductance of the wire 3 by way of the wire 82 so as to increase the degree to which interference is attenuated. Herein, in order to avoid an increase in the parasitic capacity generated between the wire that is provided for further reducing the inductive coupling and the semiconductor substrate, the overlapped top metal layer and the second metal layer are interconnected by the via 83 without using the bottom metal layer for the wire provided for further reducing the inductive coupling. As a result, it has been confirmed by electromagnetic field analysis that the degree to which interference is attenuated increases by 0.5 DB in comparison with the case where the wire for reducing the inductive coupling is arranged in one metal layer. The application of such an arrangement allows the metal layers forming wires that are used for reducing the inductive coupling to increase so as to enlarge the extent to which interference is attenuated, especially when there is a restriction in the wire width.

Now, as shown in FIG. 1, the wire 3 for reducing the inductive coupling is disposed around the inductor 1 such that the former circumscribes the latter, however the wire may be spirally disposed instead. This also applies to the wire 4.

Figure 8:
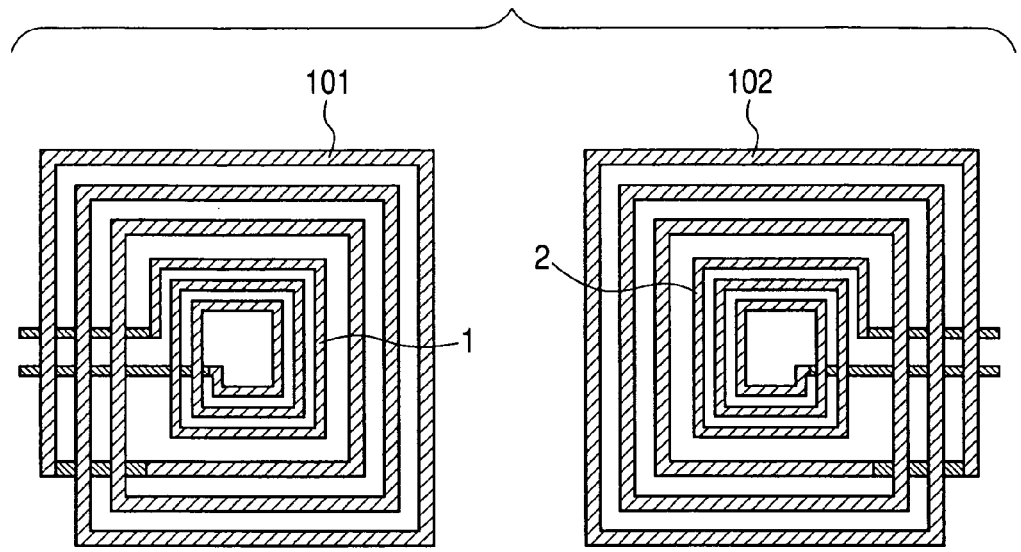
FIG. 8 is the second top view showing the inductor used for the semiconductor devices of the present invention.

FIG. 8 shows inductors in which the wires that are provided for reducing the inductive coupling are spirally disposed. In the drawing, reference numerals 101 and 102 indicate wires for reducing the inductive coupling, which wires are spirally disposed around the inductors 1 and 2, respectively. The respective wires 101 and 102 take a spiral shape with the use of three coils. Discrete metal layers and vias intervene between the outer peripheral wire and the inner peripheral wire thereof to form a closed loop wire. As the number of coils increases, the connection between the respective inductors 1 and 2 and the corresponding wires 3 and 4 increases so as to increase the induced current flowing through the respective wires 3 and 4. This further restrains interference signals caused by the mutual inductance between the inductors 1 and 2 from being conveyed in comparison with the arrangement shown in FIG. 1. Accordingly, the provision of the wire for reducing the inductive coupling with a spiral configuration further reduces the interference signals.

Figure 9:
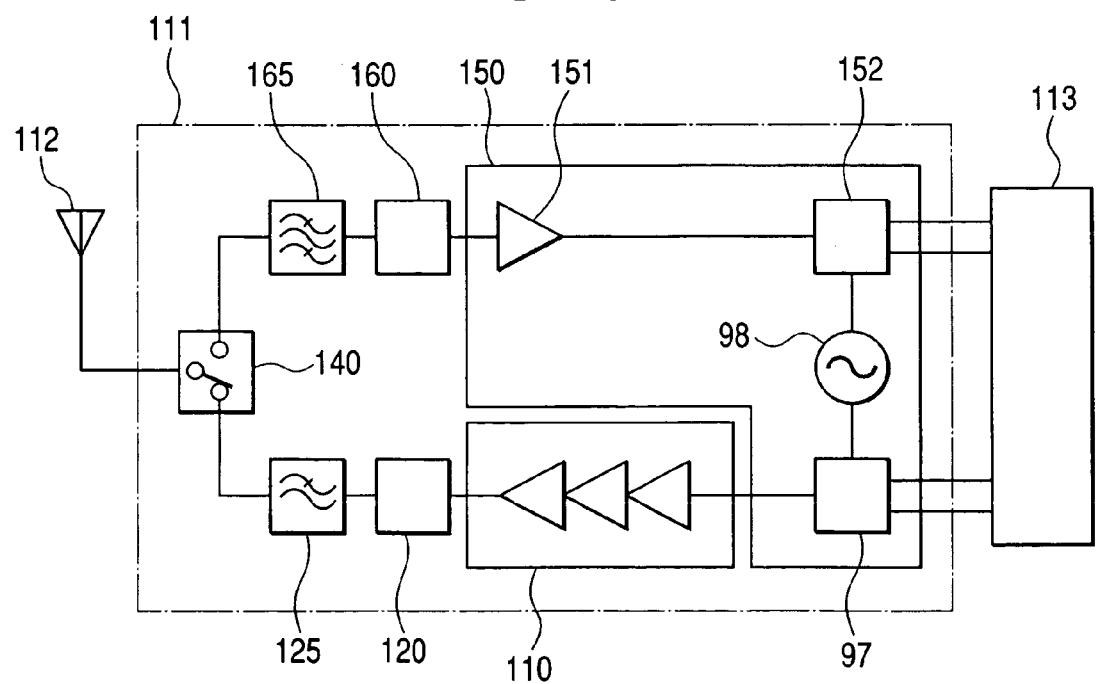
FIG. 9 is a circuit diagram showing a wireless communication circuit using the semiconductor devices of the present invention.

The semiconductor devices having an inductor that is provided with a wire for reducing the inductive coupling according to the present invention, as described above, is realized as an RF-IC, for example. This RF-IC is typically used along with a power amplifier for transmission, an antenna and a switch in the wireless communication circuit section of a portable radio terminal. The circulatory arrangement of the portable radio terminal, including a wireless communication circuit 111, is shown in FIG. 9.

The transmission section of the wireless communication circuit ill includes a modulator circuit (first circuit) to modulate carrier waves by use of a base band signal (first signal) sent from an external base band section 113 to obtain an RF signal, a power amplifier 110 to amplify the RF signal (second signal) output by the modulator circuit 97 and a low-pass filter 125 to input the RF signal output by the power amplifier 110 through an output matching circuit 120 so as to remove unwanted higher harmonics contained in the RF signal. The frequency of the base band signal, such as about 200 KHz, is converted into a radio frequency, such as about 2 GHz, by the modulator circuit 97. In addition, the communication circuit 111 is provided with a switch 140 that is connected to an external antenna 112 to supply the RF signal output from the filter 125 to the antenna 112 upon transmission and to input the RF signal output from the antenna 112 upon reception to supply the signal to a reception section. Further, the reception section of the communication circuit 111 includes a band-pass filter 165 to remove undesired disturbing waves contained in the RF signal that is input from the switch 140, a low noise amplifier 151 to input the RF signal that is output from the filter 165 through a matching circuit 160 for reception to amplify the signal and a demodulator circuit (second circuit) 152 to demodulate an RF signal (third signal) output to from the low noise amplifier 151 so as to output a base band signal (fourth signal) and supply the signal to the base band section 113. Also, a local oscillator (third circuit) 98 is provided as a common circuit for transmission and reception to generate carrier waves for modulation/demodulation and supply the carrier waves to the modulator circuit 97 and the demodulator circuit 152.

In the above-described arrangement, an RF-IC 150 is constructed as a high-frequency integrated circuit including the modulator circuit 97, the low noise amplifier 151, the demodulator circuit 152 and the local oscillator 98. Hereafter, preferred embodiments of the semiconductor devices according to the present invention, representing examples of the P1-IC, will be described.

First Embodiment

Figure 10:
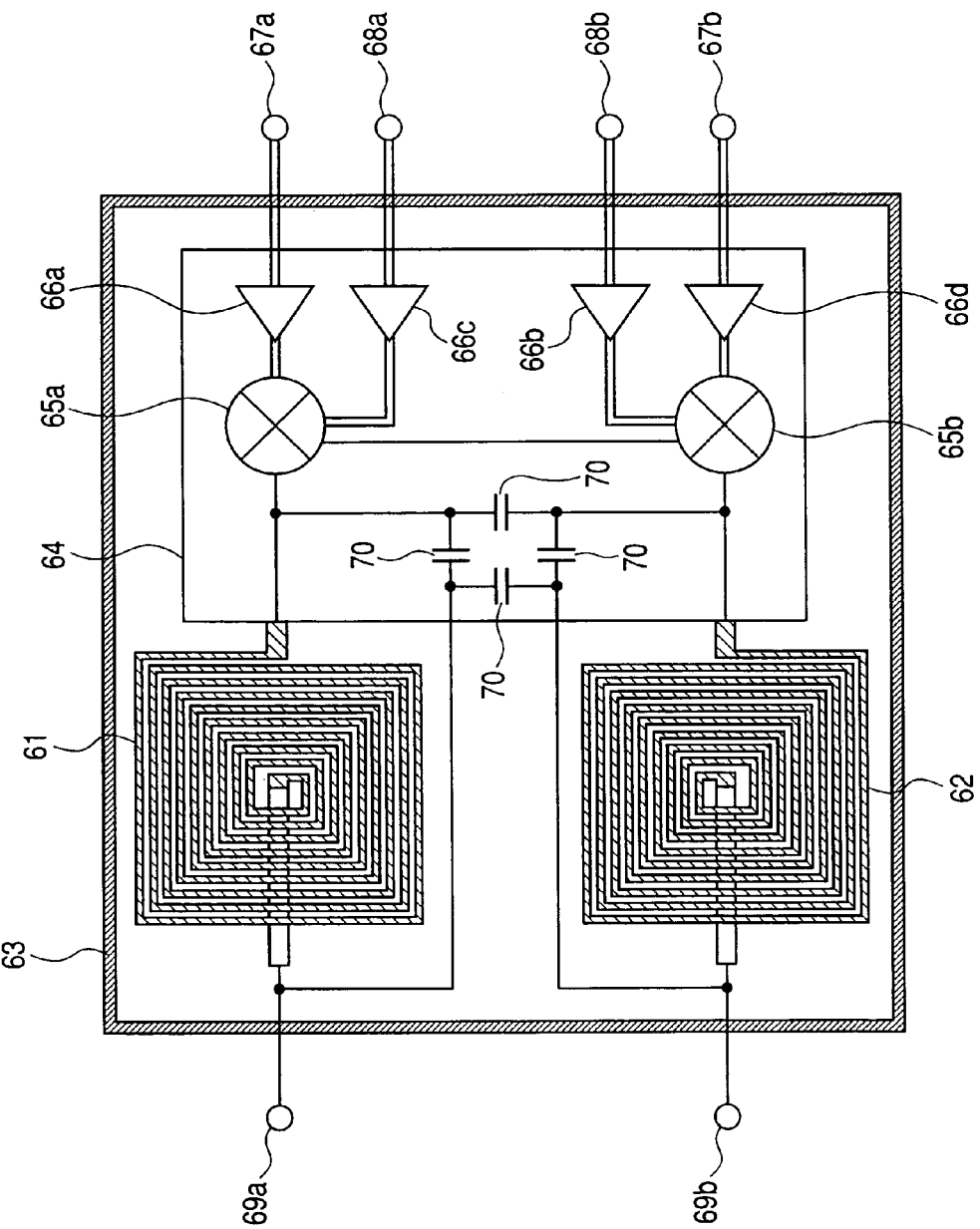
FIG. 10 is a circuit diagram showing a first embodiment for carrying out the invention.

FIG. 10 shows a first embodiment of the present invention. In this embodiment, inductors provided with wires for reducing the inductive coupling in the modulator circuit 97 are exemplified. In the drawing, reference numerals 61 and 62 respectively indicate inductors, reference numeral 63 indicates a wire for reducing the inductive coupling in the form of a closed loop wire, reference numeral 64 indicates a modulator, reference numerals 66a through 66d respectively indicate buffers, reference numerals 67a and 67b respectively indicate base band signal inputs, reference numerals 68a and 68b respectively indicate carrier wave inputs, reference numeral 69a and 69b indicate RF signal outputs and reference numeral 70 indicates a capacitor. Base band signals orthogonal to each other are input to the base band signal inputs 67a and 67b. The respective orthogonal base band signals are in the form of bipolar differential signals whose polarity is inverse relative to each other. Carrier waves (local oscillation signals) whose phase differs by 90 degrees are input to the carrier wave inputs 68a and 68b. The respective carrier waves are also bipolar differential signals whose polarity is inverse relative to each other.

The circuit including, the inductors 61 and 62 along with the capacitors 70, forms a differential low frequency wave pass filter. The base band signals input from the base band signal inputs 67a and 67b are respectively input to the mixers 65a and 65b through the buffers 66a and 66b, while the carrier waves input from the carrier wave inputs 68a and 68b are respectively input to the mixers 65a and 65b through the respective buffers 66c and 66b. In the mixers 65a and 65b, the carrier waves are modulated by the base band signals so as to turn into differential RF signals, which are input to the differential low frequency wave pass filter. To note, the same polar components of differential RF signals orthogonal to each other that are output from the mixers 65a and 65b are connected to each other, in which the RF signals of one polarity are supplied to the inductor 61, while those of the other polarity are supplied to the inductor 62.

The output signals from the mixers 65a and 65b respectively contain not only frequency components as desired, but also higher harmonic components, such as those signals having a frequency which is two or three times higher than required. For example, when the typical frequency of the RF signal is 2 GHz, higher harmonic signals are generated at 4 GHz or 6 GHz. The low frequency wave pass filter is used to remove such higher harmonic components. The RF signals with such higher harmonic components removed therefrom through use of such a filter are output to the signal outputs 69a and 69b. It is a differential signal that is input to the inductors 61 and 62, so that there is no worry about interference between those inductors. However, the magnetic field change to which one inductor is subjected has higher harmonic components so as to generate a single-phase interference signal in the other inductors and wires disposed nearby. This interference signal is attenuated by the wire 63 for reducing the inductive coupling that encloses both inductors 61 and 62, thereby to restrain the amount by which such higher harmonic components are conveyed.

The specific effect brought about by the wire for reducing the inductive coupling has been confirmed by electromagnetic field analysis. For example, where the outline of the inductors 61 and 62 is defined as 130 μm in length, 3 μm in width, 3 μm in space and nine coils, the interference signal generated in a wire positioned by 46.5 μm away from the outline of the respective inductors 61 and 62 is attenuated by about 40 dB in comparison with the 4-GHz signal input to the inductors 61 and 62. On the other hand, such interference signal is attenuated by about 45 dB when the wire 63 for reducing the inductive coupling, having 6 μm in width and 3 μm in space, is disposed around the inductors 61 and 62. Thus, the effect for reducing the inductive coupling improves by 5 dB. The provision of the wire for reducing the inductive coupling enclosing the inductors 61 and 62 in 20 combination according to the present embodiment, even without taking account of interference, allows the layout area to be reduced by as much as the reduced wire width and spatial region in comparison with disposing a wire for reducing the inductive coupling for each inductor.

Second Embodiment

Figure 11:
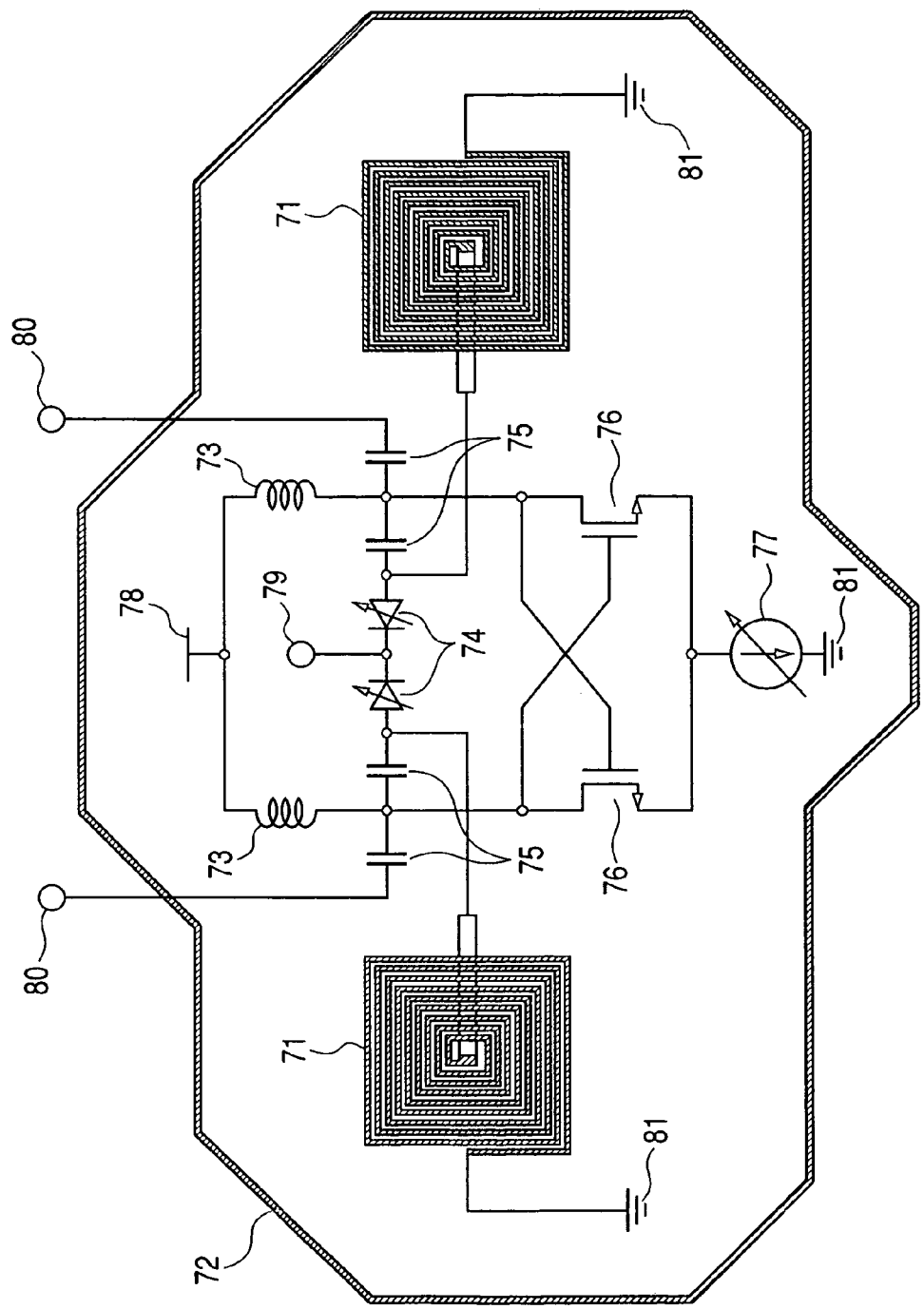
FIG. 11 is a circuit diagram showing a second embodiment for carrying out the invention.

FIG. 11 shows the second embodiment of the present invention. In this embodiment, inductors provided with a wire for reducing the inductive coupling in the local oscillator 98 are exemplified. In the drawing, an inductor 71 acting as a choke coil, a wire 72 for reducing the inductive coupling in the form of a closed loop wire, a resonance inductor 73 of an oscillator, a varactor diode 74 of variable capacity, a capacitor 75, a transistor 76, a variable current source 77 to define the operational current of the transistor, a power source 78 to supply a voltage to the transistor 76, a frequency controller 79, an oscillator output 80 and a ground 81. In this embodiment, the inductor (i.e. choke coil) 71 takes the interfered with side.

The oscillation frequency is defined by the frequency of is a resonance circuit including the indicators 73, varactor diodes 74 and capacitors 75. When a control voltage is provided to the frequency controller 79, the bias voltage charged to the respective varactor diodes 74 changes so as to change their capacity, which results in the oscillation frequency changing. Since a positive feedback circuit is arranged with the respective transistors 76, an oscillation signal of a frequency determined by the control voltage at a desired amplitude is output from the respective outputs 80. The oscillating signals are differential signals whose polarity is inverse relative to each other, and they turn into carrier waves to be supplied to the modulator circuit 97 and the demodulator circuit 152. The inductors (choke coil) 71 provide a DC ground potential to the varactor diodes 74 and block AC signals that are the oscillation signals so as to convey the signal to the oscillator outputs 80.

Herein, where an interference signal source exists nearby, this signal is conveyed to the inductor (choke coil) 71 so as to be overlapped on the oscillation signal, with the result that the oscillator outputs unwanted disturbing waves. Further, when the frequency of the interference signal is closer to that of the oscillation signal, the latter fluctuates owing to the drawing effect, as described in the Non-Patent Document 3. Such undesired disturbing waves are restrained and such drawing effect is avoided by the disposition of the wire 72 for reducing the inductive coupling.

Further, the wire 72 for reducing the inductive coupling does not take a rectangular shape as shown in FIG. 10, but takes a shape which traces the outline of the circuit block so as to reduce spatial occupancy. As a result of electromagnetic field analysis, it has been confirmed that there is no difference in the degree to which interference is attenuated, irrespective of whether a wire for reducing the inductive coupling is disposed only on the interfered with side inductor or only on the interference source side inductor, provided that such conditions as the shape, material and interval between the inductors are the same. Accordingly, when the interfered with side indictor, such as a variable frequency oscillator, is subject to interference from other circuits, the disposition of a wire for reducing the inductive coupling around such an inductor reduces the interference. Thus, the present embodiment is effective especially when there is no room for disposing a wire for reducing the inductive coupling in the interference source side inductor, so that such a wire is disposed only in the interfered with side inductor.

Third Embodiment

Figure 12:
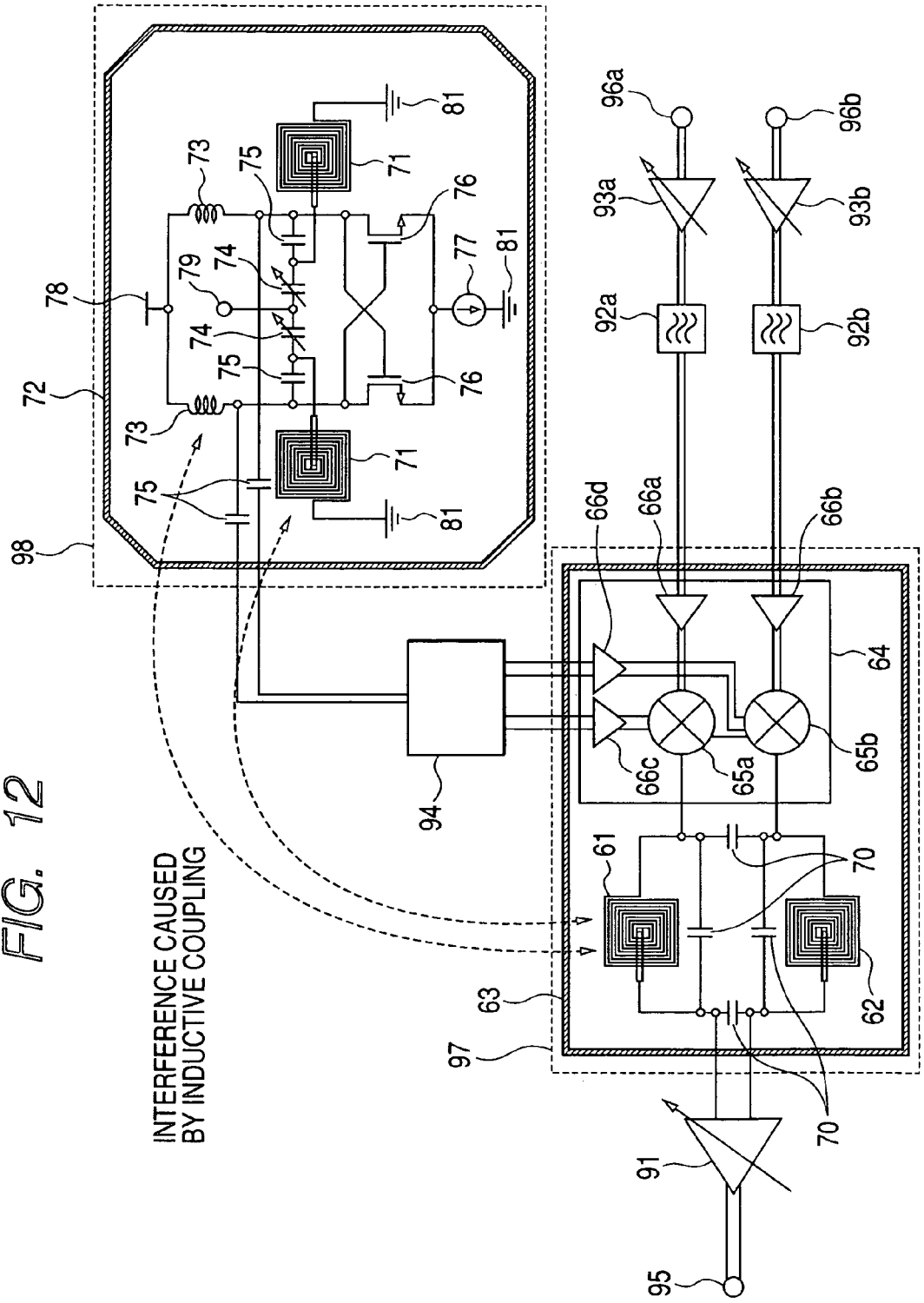
FIG. 12 is a circuit diagram showing a third embodiment for carrying out the invention.
Figure 13:
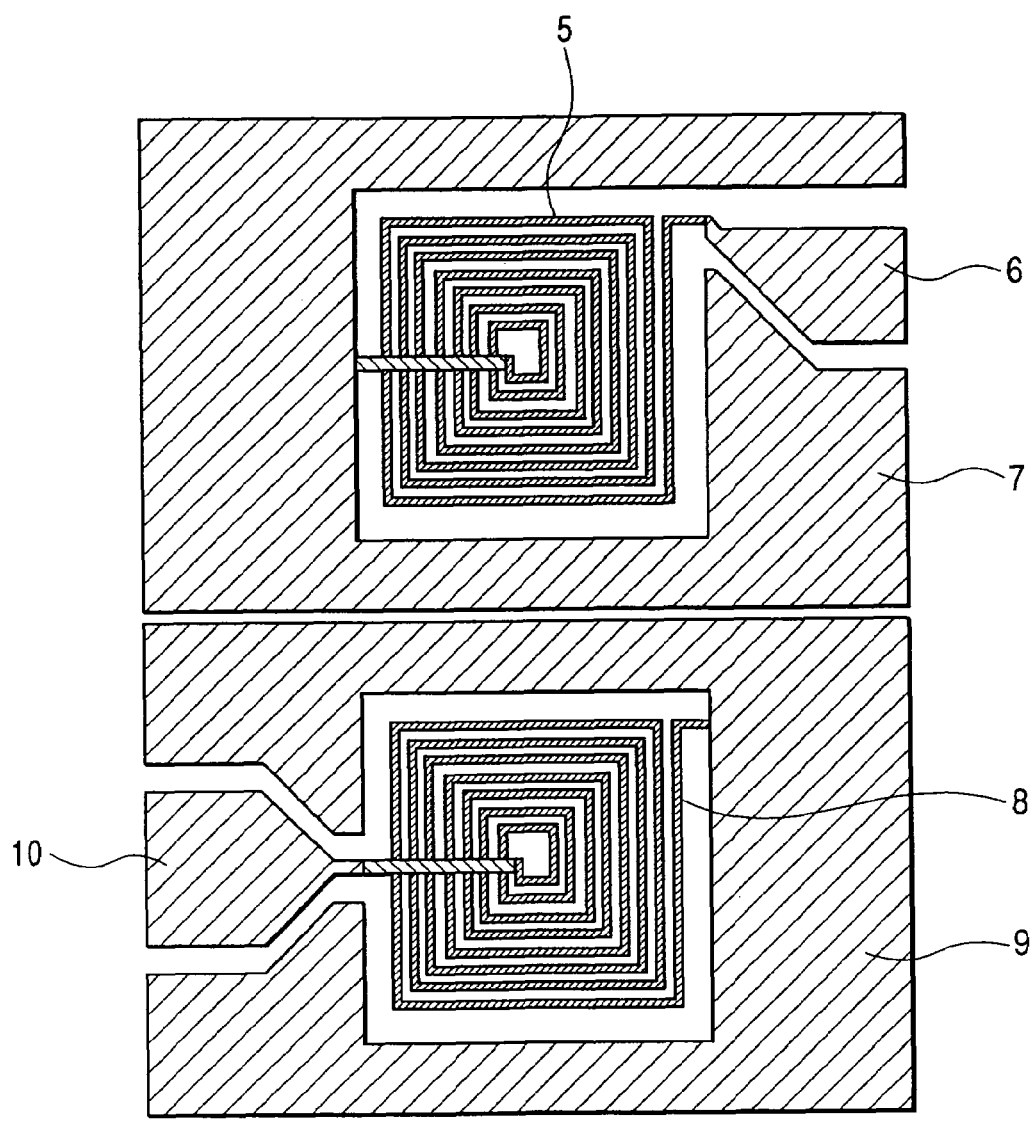
FIG. 13 is a top view showing semiconductor devices using a conventional technology.

FIG. 12 shows a third embodiment of the present invention. In this embodiment, inductors provided with a wire for reducing the inductive coupling in the modulation circuit 97 and the local oscillator 98 are exemplified. The inductors of the modulator circuit 97 take the interference source side, while those of the local oscillator 98 take the interfered with side. In the drawing, numeral reference 91 indicates an RF variable gain amplifier, reference numerals 92a and 92b indicate base band filters, reference numerals 93a and 93b indicate base band amplifiers, reference numeral 94 indicates a frequency divider, reference numeral 95 indicates an RF output, reference numerals 96a and 96b indicate base band signals, reference numeral 97 indicates a modulator circuit and reference numeral 98 indicates a local oscillator.

The modulator circuit 97 has the same arrangement as that 25 of the first embodiment, and the variable frequency oscillator 98 has the same arrangement as that of the second embodiment. The present embodiment exemplifies a transmission circuit of the direct conversion type wherein the frequency of the base band signal is converted into a radio frequency at one time by use of one carrier wave, the operation of which circuit will be briefly described below.

The differential base band signals, which are orthogonal to each other and are input to the base band inputs 96a and 96b, are amplified to desired amplitudes by the base band amplifiers 93a and 93b and are restricted within the band allowable for wireless communication by the base band filters 92a and 92b. On the other hand, where a carrier wave frequency is 2 GHz, for example, the oscillation signals of 4 GHz output from the local oscillator 98 are divided into 2 GHz representing half of the oscillation signal frequency by a frequency divider 94, so that the differential carrier waves (local oscillation signals) having a difference in phase of 90 degrees are output. The differential base band signals orthogonal to each other and the differential carrier waves having a difference in phase of 90 degrees are input to a modulator 64. The strength of the four respectively differential signals is amplified by the buffers 66a through 66d and input to the mixers 65a and 65b. The mixers 65a and 65b respectively perform QPSK (Quadrature Phase Shift Keying) modulation, that represents one of the quaternary modulation systems. 25 Hereupon, unwanted higher harmonic components, such as a two-fold and a three-fold frequency are output. Those components are blocked by a filter circuit including the inductors 61 and 62 and capacitors 70, so that the desired RF signal is taken out. After the RF signal is amplified by a variable amplifier 91, it is output to an RF output 95.

In the present transmission circuit, the inductors 61 and 62 cause a magnetic field change having such higher harmonic components in the vicinity thereof as mentioned earlier, and interference occurs between the inductors (i.e. choke coils) 71 and the inductors 73, as shown in FIG. 12. In order to reduce such interference, the respective wires 63 and 72 for reducing the inductive coupling are respectively disposed at the outer periphery of the modulator circuit 97 and the local oscillator 98. The measurement result shows that undesired higher harmonic components generated by the interference among the inductors and output from the RF output 95 is reduced by 5 dB by the disposition of such wires 63 and 72 to the modulator circuit 97 and the local oscillator 98, in comparison with the arrangement wherein there is no such disposition. The present embodiment in which a wire for reducing the inductive coupling is disposed to the interference source side inductor and the interfered with side inductor reduces undesired disturbing waves output from the modulator circuit 97.

To note, the structure of the semiconductor substrate according to the above-described embodiments is not limited to a bulk type, but may well be a SOI (silicon on insulator) substrate or a type made from a different material, such as a Sapphire substrate. Further, the frequency range applicable to the present invention is not limited to that as shown in FIG. 5. The invention is applicable not only to the spiral inductors described above, but also to an arbitrary inductor having the number of coils, the winding direction and the vertical configuration thereof modified. Further, the modulator circuit of the first and third embodiments, respectively, is of the differential type, but it may well be of the single-phase type, in which a low-pass filter is made of one inductor.

The inductor according to the present invention is widely applicable to a matching circuit and an amplifier, etc., besides the above-described oscillator and filter. There is a case where an inductor may be incorporated in the low noise amplifier 151 and the demodulator circuit 152, though there is not shown in the figure. In such case, the provision of a wire for reducing the inductive coupling to the inductor as described above reduces interference from the local oscillator 98 or from the transmission side, especially when the communication system in which transmission and reception operate simultaneously is adopted.

In the implementation of the present invention, there is neither a need to adopt a new production method for manufacture of the semiconductors, nor a worry about increased power consumption. The reduction of the self-inductance of the inductor and the increased layout area that are secondary effects of the present invention are restrained to the minimum by making the layout design in a proper manner. On the other hand, narrowing an interval between the inductors in accordance with the degree of reduction of interference by the application of the present invention increases the integration density of the circuit and allows the wireless communication circuit to be multi-functional. Also, the specifications adopted at the design stage can be eased as much as the reduction of interference, the number of designing processes can be reduced and the production period can be shortened.

According to the present invention, in semiconductor devices with inductors, interference between inductors caused by a magnetic field generated by the inductors is reduced, so that undesired noise signal output is minimized.

What is claimed is:

1. A semiconductor device comprising:
   a first circuit to modulate a carrier wave by way of a first signal to output a second signal whose frequency is higher than a frequency of said first signal;
   a second circuit to demodulate a third signal by way of said carrier wave to output a fourth signal whose frequency is lower than a frequency of said third signal; and
   a third circuit to generate said carrier wave,
   wherein at least one of said first, second and third circuits includes a first inductor,
   wherein at least one of the first, second and third circuits other than that including said first inductor includes a second inductor,
   wherein said first inductor is provided with a first permanently-closed loop wire for reducing an inductive coupling generated through mutual inductance between said first inductor and said second inductor which is provided outside of an enclosure of said first closed loop wire,
   wherein said second inductor is provided with a second permanently-closed loop wire for reducing an inductive coupling generated through mutual inductance between said second inductor and said first inductor which is provided outside of an enclosure of said second closed loop wire, and
   wherein each of said first and second permanently-closed loop wires is alternating-current-electrically separated from a ground electric potential.

2. The semiconductor device according to claim 1,
   wherein said first circuit is configured to generate a radio frequency signal as said second signal by modulating a carrier wave via a base band signal as said first signal, and
   wherein said second circuit is configured to generate a base band signal as said fourth signal by demodulating a radio frequency signal as said third signal via said carrier wave.

3. The semiconductor device according to claim 1,
   wherein at least one circuit element is disposed in addition to said first inductor within an enclosure of said first closed loop wire.

4. The semiconductor device according to claim 1,
   wherein said first circuit includes said first inductor and the third circuit includes said second inductor.

5. The semiconductor device according to claim 2,
   wherein at least one circuit element is disposed in addition to said first inductor within an enclosure of said first closed loop wire.

6. The semiconductor device according to claim 1,
   wherein each of said first and second permanently-closed loop wires is coupled to a ground electric potential through a third inductor to be alternating-current-electrically separated from the ground electric potential.

7. The semiconductor device according to claim 6,
   wherein said first circuit is configured to generate a radio frequency signal as said second signal by modulating a carrier wave via a base band signal as said first signal, and
   wherein said second circuit is configured to generate a base band signal as said fourth signal by demodulating a radio frequency signal as said third signal via said carrier wave.

8. The semiconductor device according to claim 6, wherein at least one circuit element is disposed in addition to said first inductor within an enclosure of said first closed loop wire.

9. The semiconductor device according to claim 6,
   wherein said first circuit includes said first inductor and the third circuit includes said second inductor.

10. The semiconductor device according to claim 7, wherein at least one circuit element is disposed in addition to said first inductor within an enclosure of said first closed loop wire.

11. A semiconductor device comprising:
    a first circuit to modulate a carrier wave by way of a first signal to output a second signal whose frequency is higher than a frequency of said first signal; and
    a second circuit to generate said carrier wave,
    wherein said first circuit includes a first inductor,
    wherein said second circuit includes a second inductor,
    wherein said first inductor is provided with a first permanently-closed loop wire for reducing an inductive coupling generated through mutual inductance between said first inductor and said second inductor which is provided outside of an enclosure of said first closed loop wire,
    wherein said second inductor is provided with a second permanently-closed loop wire for reducing an inductive coupling generated through mutual inductance between said second inductor and said first inductor which is provided outside of an enclosure of said second closed loop wire, and
    wherein each of said first and second permanently-closed loop wires is alternating-current-electrically separated from a ground electric potential.

12. The semiconductor device according to claim 11,
    wherein said first circuit is configured to generate a radio frequency signal as said second signal by modulating a carrier wave via a base band signal as said first signal.

13. The semiconductor device according to claim 11,
    wherein at least one circuit element is disposed in addition to said first inductor within an enclosure of said first closed loop wire.

14. The semiconductor device according to claim 12,
    wherein at least one circuit element is disposed in addition to said first inductor within an enclosure of said first closed loop wire.

15. The semiconductor device according to claim 11,
    wherein each of said first and second permanently-closed loop wires is coupled to a ground electric potential through a third inductor to be alternating-current-electrically separated from the ground electric potential.

16. The semiconductor device according to claim 15,
    wherein said first circuit is configured to generate a radio frequency signal as said second signal by modulating a carrier wave via a base band signal as said first signal.

17. The semiconductor device according to claim 15,
    wherein at least one circuit element is disposed in addition to said first inductor within an enclosure of said first closed loop wire.

18. The semiconductor device according to claim 16,
    wherein at least one circuit element is disposed in addition to said first inductor within an enclosure of said first closed loop wire.

* * * * *